(12) United States Patent
Lee

(10) Patent No.: US 9,333,600 B2
(45) Date of Patent: May 10, 2016

(54) METHOD FOR TENSIONING VAPOR DEPOSITION MASK USING AN ALIGNMENT MASTER GLASS

(71) Applicant: SAMSUNG DISPLAY CO., LTD., Yongin, Gyeonggi-Do (KR)

(72) Inventor: Sang-Shin Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/506,136

(22) Filed: Oct. 3, 2014

(65) Prior Publication Data

US 2015/0052724 A1 Feb. 26, 2015

Related U.S. Application Data

(62) Division of application No. 13/137,903, filed on Sep. 21, 2011, now Pat. No. 8,851,009.

(30) Foreign Application Priority Data

Jan. 5, 2011 (KR) ........................ 10-2011-0001077

(51) Int. Cl.
| | | |
|---|---|---|
| B05D 5/06 | (2006.01) | |
| B23P 17/00 | (2006.01) | |
| H01L 51/00 | (2006.01) | |
| H01L 51/56 | (2006.01) | |
| G01B 11/02 | (2006.01) | |
| C23C 14/04 | (2006.01) | |

(52) U.S. Cl.
CPC .............. *B23P 17/00* (2013.01); *C23C 14/042* (2013.01); *G01B 11/02* (2013.01); *H01L 51/0011* (2013.01); *H01L 51/56* (2013.01); *C23C 14/04* (2013.01); *Y10T 29/4978* (2015.01); *Y10T 29/49778* (2015.01)

(58) Field of Classification Search
None
See application file for complete search history.

(56) References Cited

U.S. PATENT DOCUMENTS

| | | |
|---|---|---|
| 4,776,868 A | 10/1988 | Trotter, Jr. et al. |
| 2008/0100782 A1 | 5/2008 | Choi et al. |
| 2008/0318140 A1 | 12/2008 | Hayashi et al. |
| 2009/0130574 A1 | 5/2009 | Hayashi et al. |
| 2009/0233188 A1 | 9/2009 | Amano et al. |
| 2012/0183676 A1* | 7/2012 | Sonoda ................. C23C 14/042 427/8 |

FOREIGN PATENT DOCUMENTS

| | | | |
|---|---|---|---|
| JP | 61-229386 A | 10/1986 | |
| JP | 62-066632 A | 3/1987 | |

(Continued)

OTHER PUBLICATIONS

Korean Office Action dated Jun. 14, 2012—from corresponding KR 10-2011-0001077.
Korean Notice of Allowance dated Nov. 1, 2012—from corresponding KR 10-2011-0001077.

(Continued)

*Primary Examiner* — Dah-Wei D. Yuan
*Assistant Examiner* — Jethro M Pence
(74) *Attorney, Agent, or Firm* — Lee & Morse, P.C.

(57) ABSTRACT

An alignment master glass for aligning a plurality of openings of a vapor deposition mask for tensioning the vapor deposition mask, the alignment master glass includes a transparent substrate, and reflective film patterns on at least one surface of the transparent substrate, the reflective film patterns being only at locations corresponding to the plurality of openings of the vapor deposition mask.

13 Claims, 8 Drawing Sheets

(56) References Cited

FOREIGN PATENT DOCUMENTS

| | | |
|---|---|---|
| JP | 2006-037203 A | 2/2006 |
| JP | 2006-114402 A | 4/2006 |
| JP | 2007-311257 A | 11/2007 |
| JP | 2008-300056 A | 12/2008 |
| KR | 1998-0031868 A | 7/1998 |
| KR | 10-2005-0053426 A | 6/2005 |
| KR | 10-2006-0055613 A | 5/2006 |
| KR | 10-0759698 B1 | 9/2007 |
| KR | 10-2007-0097218 A | 10/2007 |

OTHER PUBLICATIONS

Japanese Office Action dated Feb. 26, 2003—from corresponding JP 2011-183640.

Japanese Notice of Allowance dated Jul. 2, 2013—from corresponding JP 2011-183640.

Chinese Office Action dated Mar. 5, 2014—from corresponding CN 201110398155.1.

Taiwanese Office Action dated Jul. 22, 2014—from corresponding TW 100142625.

* cited by examiner

METHOD FOR TENSIONING VAPOR DEPOSITION MASK USING AN ALIGNMENT MASTER GLASS

CROSS REFERENCE TO RELATED APPLICATION

This is a divisional application based on pending application Ser. No. 13/137,903, filed Sep. 21, 2011, the entire contents of which is hereby incorporated by reference.

BACKGROUND

1. Field

Example embodiments relate to an alignment master glass for tensioning a vapor deposition mask, a method for manufacturing the same, and a method for tensioning the vapor deposition mask using the same. More particularly, example embodiments relate to an alignment master glass for tensioning a vapor deposition mask for depositing an organic emissive layer of an organic light emitting display device, a method for manufacturing the same, and a method for tensioning the vapor deposition mask using the same.

2. Description of the Related Art

Recently, electroluminescent (EL) devices regarded as self-luminous type display devices have been receiving a lot of attention as next-generation display devices due to, e.g., a wide viewing angle, good contrast, and rapid response characteristics. For example, an organic EL device may include a series of first electrodes formed as a predetermined pattern on a transparent insulating substrate, an organic emissive layer formed on the transparent insulating substrate by vacuum deposition, and a series of second electrodes formed on the organic emissive layer to act as a cathode electrode intersecting the first electrodes.

In the manufacture of an organic EL device having such a structure as described above, the first electrodes may be patterned by wet etching, e.g., a photolithography method. However, when a photolithography method is applied to etch the second electrodes, liquid may permeate into the interface between the organic emissive layer and the second electrodes, while the resist used is stripped off and the second electrodes are etched, thereby degrading the performance and lifetime characteristics of the organic EL device. For example, if the wet etching process is performed after at least a portion of the organic layer is formed, moisture may penetrate into or remain in the organic layer during the wet etching process, thereby noticeably deteriorating the performance and lifespan characteristics of the completed organic EL device.

In view of the above, the organic layer, i.e., the emissive organic layer implementing a predetermined color, and the second electrodes formed on the organic layer may be patterned, e.g., micro-patterned, by deposition. For example, the deposition method may include use of a mask with a series of long slits spaced a predetermined distance apart in its main thin plate. In another example, the deposition method may use a mask of a metal thin plate having a slit portion and a bridge portion in a mesh pattern.

In yet another example, the deposition method may use a support frame fixed to a metal thin plate, e.g., a vapor deposition mask, with tension applied to the metal thin plate, e.g., via adhesive or welding. For example, referring to FIG. 1, tension may be applied using a tensioning device to a vapor deposition mask 1, which includes a plurality of openings 3 on a substrate 2, so material may be deposited through the openings 3 to form a desired pattern. However, despite adhesion between the metal thin plate and a substrate, the openings in the metal thin plate may sag away from the substrate by the weight of the metal thin plate, even though the edges of the metal thin plate may be supported under tension by a frame. In addition, thermal expansion of the mask due to a rising temperature during formation of an organic film may facilitate the sagging of the openings.

SUMMARY

Example embodiments provide an alignment master glass for tensioning a vapor deposition mask, which can obtain a reflected light image having a clear and distinct boundary by reflecting light on the vapor deposition mask and the alignment master glass.

Example embodiments also provide a method for manufacturing an alignment master glass for tensioning a vapor deposition mask, which can obtain a reflected light image having a clear and distinct boundary by reflecting light on the vapor deposition mask and the alignment master glass.

Example embodiments also provide a method for tensioning a vapor deposition mask using an alignment master glass for tensioning the vapor deposition mask, which can obtain a reflected light image having a clear and distinct boundary by reflecting light on the vapor deposition mask and the alignment master glass.

According to an aspect of the example embodiments, there is provided an alignment master glass for aligning a plurality of openings formed in a vapor deposition mask in tensioning the vapor deposition mask for depositing an organic material, the alignment master glass including a transparent substrate, and reflective film patterns on at least one surface of the transparent substrate, the reflective film patterns being only at locations corresponding to the plurality of openings of the vapor deposition mask.

The reflective film patterns may include a metallic material.

The reflective film patterns may include at least one of molybdenum (Mo) and tungsten (W).

The reflective film patterns may be smaller than the plurality of openings.

According to an aspect of the example embodiments, there is provided a method for manufacturing an alignment master glass for tensioning a vapor deposition mask having a plurality of openings used to deposit an organic material, the method including providing a transparent substrate, and forming reflective film patterns on at least one surface of the transparent substrate, such that the reflective film patterns are only at locations corresponding to the plurality of openings of the vapor deposition mask.

Forming the reflective film patterns may include forming patterns of a metallic material.

Forming the reflective film patterns may include forming patterns of at least one of molybdenum (Mo) and tungsten (W).

Forming the reflective film patterns may include forming the reflective film patterns to be smaller than the plurality of openings.

According to an aspect of the example embodiments, there is provided a method for tensioning a vapor deposition mask using an alignment master glass, the method including providing the vapor deposition mask having a plurality of openings for depositing an organic material, providing the alignment master glass for tensioning the vapor deposition mask, the alignment master glass including reflective film patterns formed at only locations corresponding to the openings of the vapor deposition mask, tensioning the vapor deposition mask using a tensioning device, allowing centers of the openings and centers of the reflective film patterns to coincide with each other, obtaining a reflected light image indicating an alignment state in which the centers of the openings of the vapor deposition mask and the centers of the reflective film patterns are aligned, and analyzing the reflected light image and determining the alignment state in which the openings of the vapor deposition mask and the reflective film patterns are aligned after tensioning, wherein a first region in the reflected light image between the aligned openings and the reflective film patterns correspond to dark portions.

The method may further include repeatedly performing the steps of tensioning through analyzing based on a first axis and a second axis of the vapor deposition mask, when the centers of the openings do not coincide with the centers of the reflective film patterns.

The first region may be defined by a region between outer boundaries of aligned openings and respective reflective film patterns.

The reflected light image may further include a second region excluding the first region, the second region forming bright portions on the reflected light image.

Allowing the centers of the openings and the centers of the reflective film patterns to coincide may include measuring widths of the openings based on a first axis and determining the centers of the openings, measuring widths of the reflective film patterns based on a second axis and determining the centers of the reflective film patterns, and shifting the vapor deposition mask or the alignment master glass to allow the centers of the widths of the openings and the centers of the widths of the reflective film patterns to coincide with each other.

Allowing the centers of the openings and the centers of the reflective film patterns to coincide may further include repeatedly performing the steps of measuring through shifting based on the first and second axes.

Analyzing the reflected light image and determining the alignment state may include measuring widths of the openings based on a first axis and determining centers of the widths of the openings, measuring widths of the reflective film patterns based on a second axis and determining centers of the widths of the reflective film patterns, and determining whether the centers of the widths of the openings coincide with the centers of the widths of the reflective film patterns.

Analyzing the reflected light image and determining the alignment state may further include repeatedly performing the steps of measuring through determining based on the first and second axes.

According to an aspect of the example embodiments, there is provided a method for tensioning a vapor deposition mask using an alignment master glass, the method including obtaining a reflected light image by irradiating light into openings formed in the vapor deposition mask and into reflective film patterns formed in the alignment master glass for tensioning the vapor deposition mask, the reflected light image representing an alignment state in which centers of the openings and centers of the reflective film patterns are aligned, analyzing the reflected light image, and determining the alignment state in which the openings and the reflective film patterns are aligned after tensioning, wherein the reflected light image has a first region defined between outer boundaries of the aligned openings and respective reflective film patterns, and a second region excluding the first region, the first and second regions forming respective dark and bright portions on the reflected light image.

Each of the reflective film patterns may be smaller than a respective opening.

The reflective film patterns may be made of a metallic material that reflects light.

The reflective film patterns may be made of at least one of molybdenum (Mo) and tungsten (W).

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
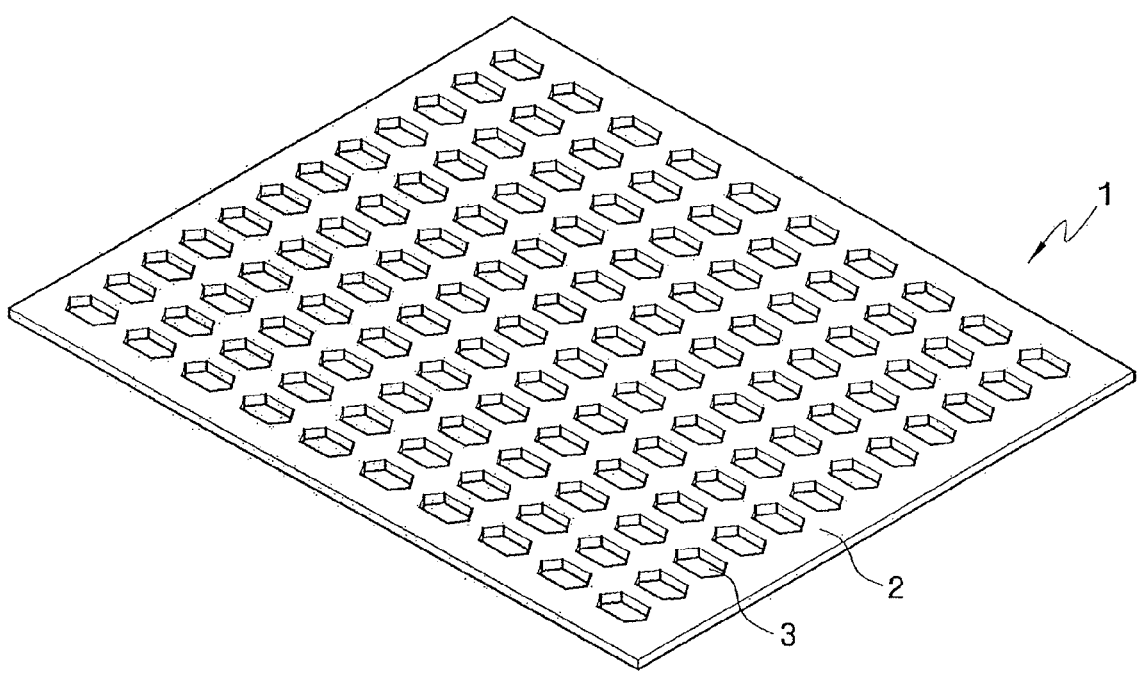
FIG. 1 illustrates a conventional vapor deposition mask.

Korean Patent Application No. 10-2011-0001077, filed on Jan. 5, 2011, in the Korean Intellectual Property Office, and entitled: "Alignment Master Glass for Tensioning Vapor Deposition Mask, Method for Manufacturing the Same, and Method for Tensioning Vapor Deposition Mask Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will also be understood that when a layer is referred to as being "connected to" another layer, it can be directly connected to the other layer, or intervening layers may also be present. In contrast, when a layer is referred to as being "directly on" or "directly connected to" another layer, there are no intervening layers present. Like reference numerals refer to like elements throughout.

As used herein, the term "and/or" includes any and all combinations of one or more of the associated listed items. Further, spatially relative terms, such as "below," "beneath,"

"lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Figure 2:
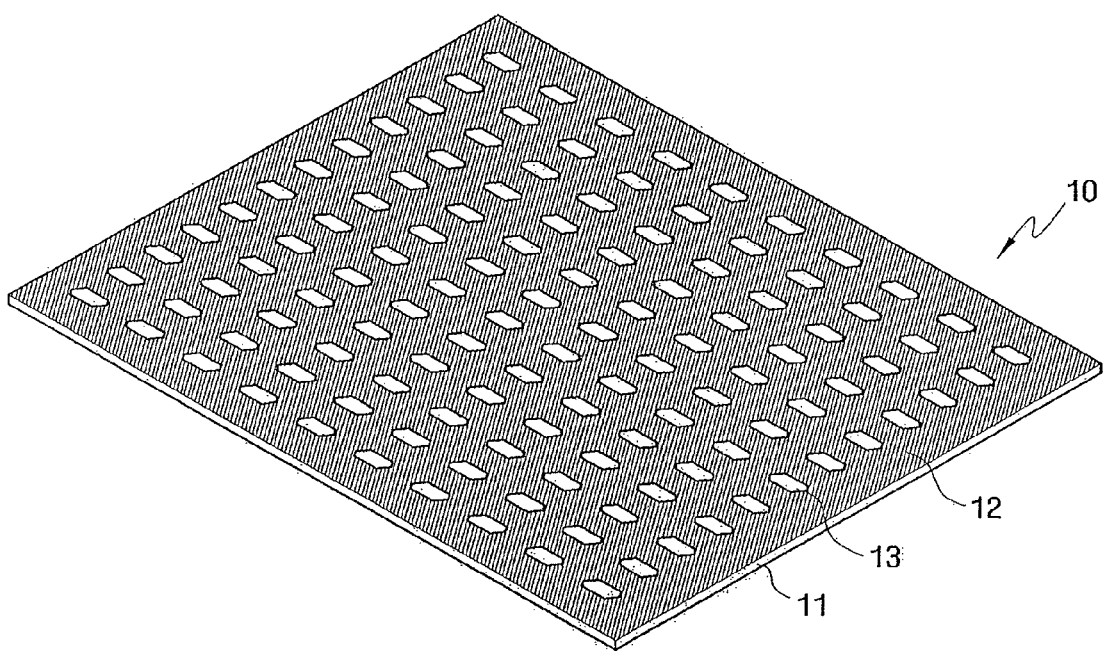
FIG. 2 illustrates a perspective view of an alignment master glass for tensioning a vapor deposition mask according to an embodiment.
Figure 3:
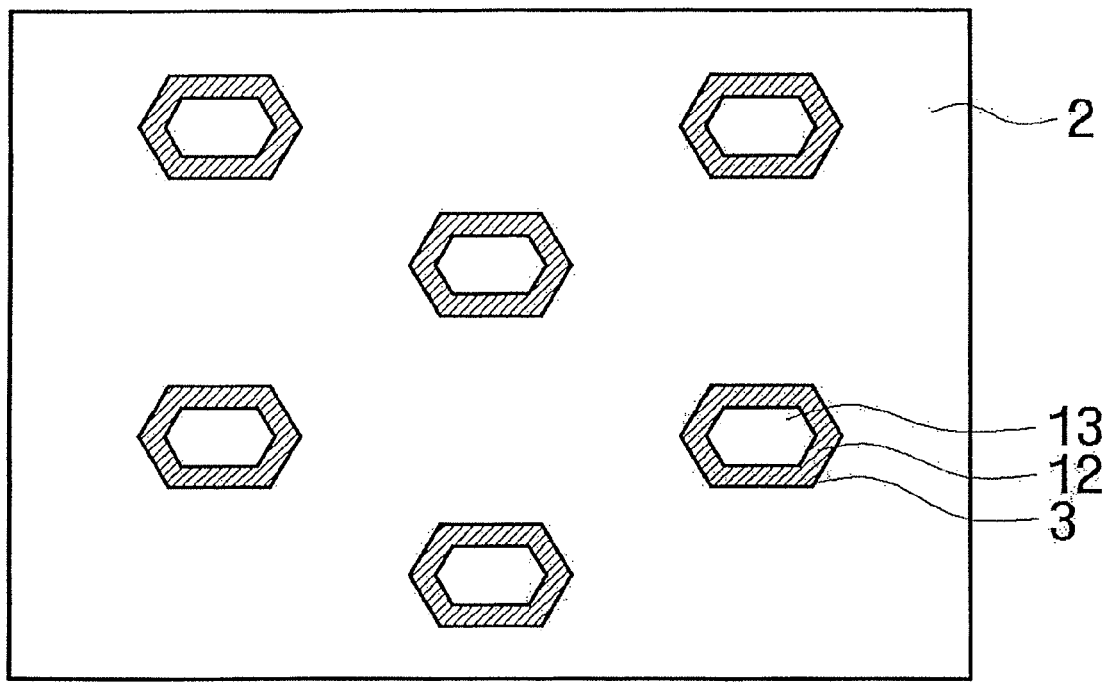
FIG. 3 illustrates a portion of a reflected light image obtained by irradiating light through a superimposed structure of an alignment master glass and a vapor deposition mask according to an embodiment.
Figure 4:
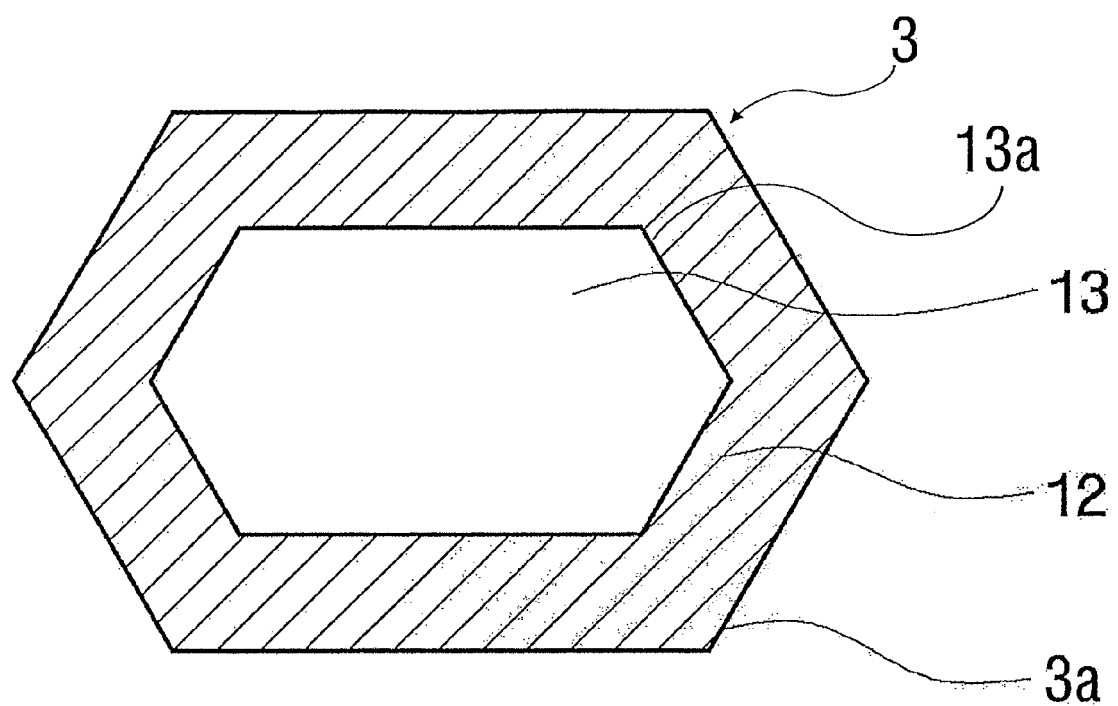
FIG. 4 illustrates an enlarged view of the reflected light image in FIG. 3.
Figure 5:
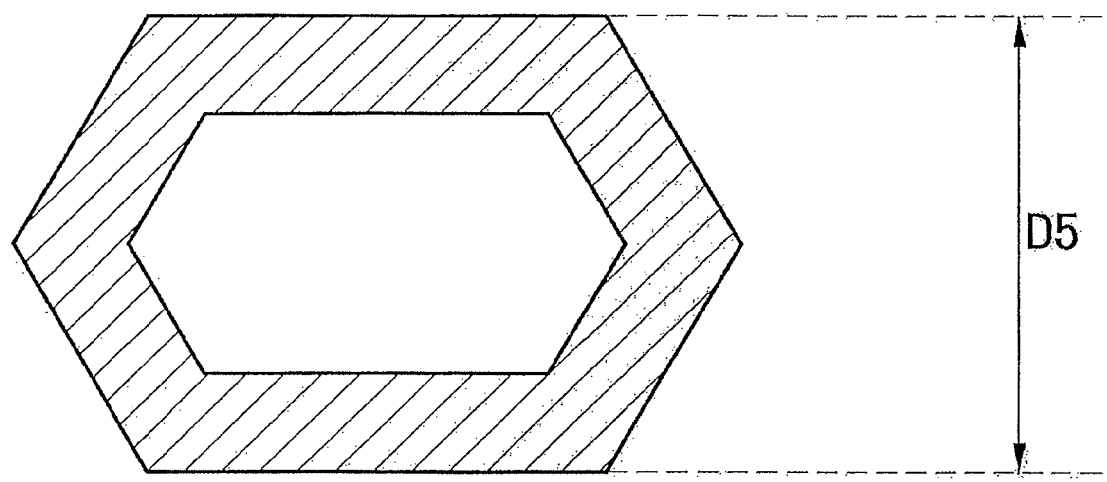
FIG. 5 illustrates a width of an opening measured from a reflected light image in FIG. 4.
Figure 6:
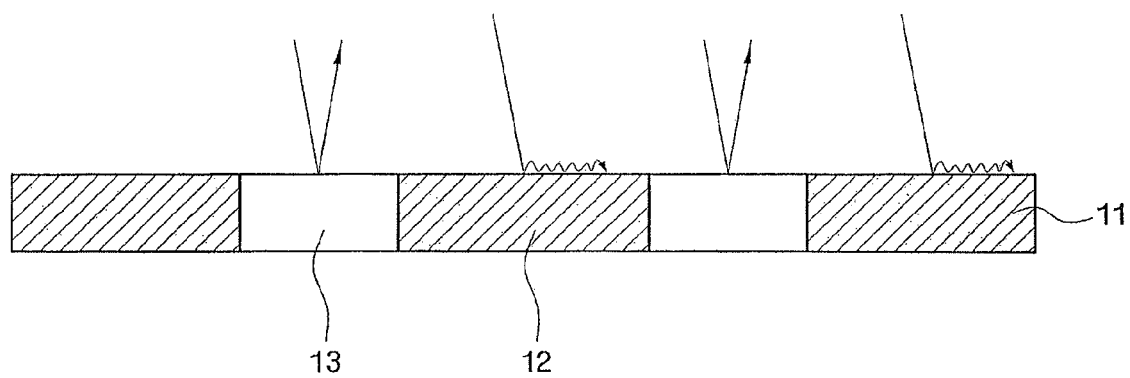
FIG. 6 illustrates a light reflecting pattern of an alignment master glass for tensioning a vapor deposition mask according to an embodiment.

Hereinafter, an embodiment will be described with reference to FIGS. 2-6. FIG. 2 illustrates a perspective view of an alignment master glass for tensioning a vapor deposition mask according to an embodiment, FIG. 3 illustrates a portion of a reflected light image obtained by irradiating light on a superimposed structure of an alignment master glass and a vapor deposition mask according to an embodiment, FIG. 4 illustrates an enlarged view of the reflected light image shown in FIG. 3, FIG. 5 illustrates a width of an opening measured from the reflected light image in FIG. 4, and FIG. 6 illustrates a light reflecting pattern of the alignment master glass for tensioning a vapor deposition mask according to an embodiment.

Referring to FIG. 2, an alignment master glass 10 according to example embodiments may include a transparent substrate 11 and reflective film patterns 13 coated on at least one surface of the transparent substrate 11. The alignment master glass 10 may be aligned with the vapor deposition mask 1 to determine whether the plurality of openings 3 in the vapor deposition mask 1 (FIG. 1) is aligned with a desired level of precision, so tension, i.e., external force, applied to the vapor deposition mask 1 and the plurality of openings 3 therein may be adjusted based on the determined alignment state in an effort to avoid deformation of the vapor deposition mask 1 and the openings 3 therein. In addition, the level of precision of the openings 3 in the vapor deposition mask 1 may be increased by adjusting the distribution of the openings 3, the tension, and the direction of tension applied on a tensioning device.

The reflective film patterns 13 of the alignment master glass 10 may be formed, e.g., only, at locations corresponding to a plurality of openings, e.g., openings 3, in a corresponding vapor deposition mask, i.e., vapor deposition mask 1, and may reflect light.

The transparent substrate 11 may be made of a transparent material capable of transmitting light, e.g., a plastic material. The transparent substrate 11 may be superimposed on the vapor deposition mask 1, and may be made of a rigid material that is less deformable than a soft material, e.g., glass, to obtain a precise reflected light image for determining the positional accuracy of the vapor deposition mask 1. As will be described later, since a region without the reflective film patterns 13 is a transparent region that transmits light, it may form light-transmitting regions 12. In addition, since light is not reflected from the region without the reflective film patterns 13 when obtaining a reflected light image on a tensioning device, the region without the reflective film patterns 13 may form dark portions on the reflected light image (dark regions indicated by hatched regions in FIGS. 2-6).

The reflective film patterns 13 may be formed on the transparent substrate 11, e.g., on one surface of the transparent substrate 11, in a predetermined pattern. As described above, the reflective film patterns 13 may correspond to the openings 3 of the vapor deposition mask 1. That is, when the vapor deposition mask 1 and the alignment master glass 10 are aligned on top of each other, as shown in FIG. 3, the reflective film patterns 13 may be aligned with, e.g., centered with respect to, the openings 3. The reflective film patterns 13 may be smaller than the openings 3, so that they serve as bases in the tensioning device in determining whether the vapor deposition mask 1 and the alignment master glass 10 are precisely aligned.

Since the reflective film patterns 13 reflect light, they form bright portions (bright regions indicated by non-hatched regions in FIGS. 3-5) on the reflected light image in obtaining the reflected light image from the tensioning device. Thus, the reflective film patterns 13 may be made of a light-reflecting material, e.g., a metallic material. Examples of the metallic material may include molybdenum (Mo) and/or tungsten (W).

As described above, the alignment master glass 10 having the reflective film patterns 13 formed thereon may be used to increase the level of precision of the vapor deposition mask 1 by determining the alignment state in which the openings 3 formed on the vapor deposition mask 1 are aligned. Tension may be adjusted based on the determined alignment state.

In detail, the reflective film patterns 13 that reflect light may be formed only within regions corresponding to the openings 3 of the vapor deposition mask 1, and the other region, i.e., regions of the substrate 11 surrounding the film patterns 13, may be formed as the light-transmitting regions 12 that do not reflect light. As the reflective film patterns 13 are smaller than the openings 3 and within, e.g., completely within, the openings 3 when the master alignment glass 10 an the vapor deposition mask 1 are superimposed, portions of the light-transmitting regions 12 surrounding the reflective film patterns 13 show through the openings 3. In other words, each opening 3 may expose a respective reflective film pattern 13 surrounded by a portion of a respective light-transmitting region 12. Therefore, when light is irradiated on a superimposed structure of the vapor deposition mask 1 with the alignment master glass 10, a resultant image of reflected light (FIGS. 3-4) may clearly reflect the respective reflective film pattern 13 and the respective light-transmitting region 12 as bright and dark regions, respectively, to indicate an alignment precision state of the openings 3 in the vapor deposition mask 1. As illustrated in FIG. 4, the dark region may be defined between an outer boundary 13a of the reflective film pattern 13 and an outer boundary 3a of a corresponding opening 3.

That is, as illustrated in FIG. 3, when the reflected light image is obtained using the alignment master glass 10, the light-transmitting regions 12 of the alignment master glass 10, i.e., the non-reflective regions, may define a distinct boundary between a light reflecting region of a front substrate 2 of the vapor deposition mask 1 and a light reflecting region formed by the reflective film patterns 13 of the alignment master glass 10. In other words, as portions of the light-transmitting regions 12 surrounding the reflective film patterns 13 and showing through the openings 3 transmit light, the resultant image exhibits dark regions (hatched regions in FIGS. 3-6) between the reflective film patterns 13 and the front substrate 2. Thus, a shadow region may not be formed due to the reflected light from adjacent regions, e.g., as compared to conventional art. Accordingly, a reflected light image having a distinct boundary, i.e., via the illustrated hatched regions, may be obtained, as shown in FIGS. 3-4. Therefore, as shown in FIG. 5, the clear and distinct boundary of each of the openings 3 of the vapor deposition mask 1 may be defined from the reflected light image. In addition, the alignment state of the vapor deposition mask 1 and the alignment master glass 10 may be determined by calculating a boundary distance of the opening 3, and the alignment state may be modified.

In detail, as shown in FIGS. 3-4, in order to determine the alignment state of the vapor deposition mask 1 after tensioning, the alignment master glass 10 may be closely adhered to a rear surface of the vapor deposition mask 1. The alignment master glass 10 may be adhered, such that the reflective film patterns 13 are positioned within the openings 3 of the vapor deposition mask 1. Then, light may be irradiated through the combined vapor deposition mask 1 and alignment master glass 10, for micro-positioning and micro-aligning, thereby obtaining the reflected light image.

In the alignment master glass 10, the reflective film patterns 13 are patterned and arranged at a predetermined pitch and serve as bases for alignment, so the region excluding the reflective film patterns 13 may be formed as light-transmitting regions 12. Accordingly, the obtained reflected light image, as shown in FIGS. 3-4, is configured to have the reflective film patterns 13 surrounded by the light-transmitting regions 12 within the openings 3.

Thus, as shown in FIG. 5, a clear and distinct boundary of the opening 3 may be determined based on the reflected light image. Therefore, the alignment state of the vapor deposition mask 1 may be determined by accurately measuring the boundary distance D5.

Referring to FIG. 6, the reflective film patterns 13 and the light-transmitting regions 12 of the alignment master glass 10 may be defined in the substrate 11. That is, the reflective film patterns 13 may be arranged on the transparent substrate 11 in a predetermined interval, and light may be reflected from regions having the reflective film patterns 13. Thus, the reflective film patterns 13 are represented as bright portions on the reflected light image. However, since light is transmitted through the light-transmitting regions 12, the light-transmitting regions 12 are represented as dark portions on the reflected light image.

As described above, since the alignment master glass 10 includes light-reflecting regions and light-transmitting regions, a reflected light image having a clear and distinct boundary may be obtained by tensioning the vapor deposition mask 1 using a tensioning device and capturing the reflected light image to determine an alignment state. In addition, a vapor deposition mask with high position accuracy may be manufactured.

Figure 7:
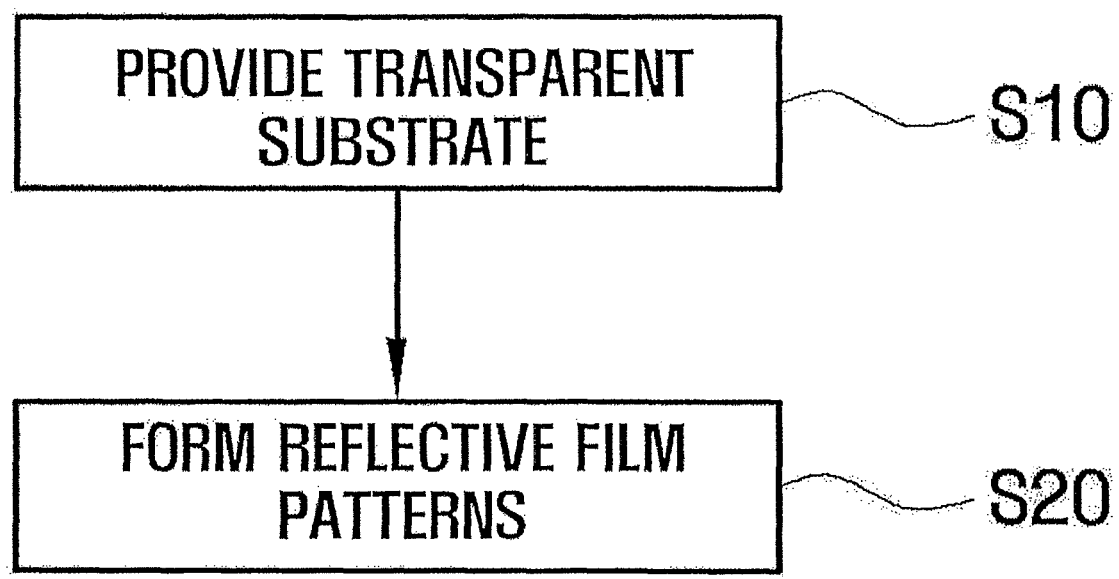
FIG. 7 illustrates a flow chart of a method for manufacturing an alignment master glass for tensioning a vapor deposition mask according to an embodiment.

A method for manufacturing an alignment master glass for tensioning a vapor deposition mask according to an embodiment will be described with reference to FIG. 7. FIG. 7 illustrates a flow chart of a method for manufacturing an alignment master glass for tensioning a vapor deposition mask according to an embodiment.

The method for manufacturing an alignment master glass for tensioning a vapor deposition mask for depositing an organic material may include providing a transparent substrate, and forming reflective film patterns that reflect light, e.g., only, on one surface of the transparent substrate in regions corresponding to openings of the vapor deposition mask. The method will be described in detail with reference to the alignment master glass 10.

First, the transparent substrate 11 may be provided (S10). The transparent substrate 11 may be made of a transparent material capable of transmitting light, e.g., a plastic material. The transparent substrate 11 may be positioned to be superimposed on the vapor deposition mask 1, and may be made of a rigid material that is less deformable than a soft material. For example, the transparent substrate 11 may be made of a transparent rigid material, e.g., glass, to obtain a precise reflected light image for determining the positional accuracy of the vapor deposition mask 1.

Next, the reflective film patterns 13 may be formed on one surface of the transparent substrate 11 (S20). The reflective film patterns 13 may be formed on the transparent substrate 11 in a predetermined pattern. For example, the reflective film patterns 13 may be formed in a discontinuous pattern, so portions of the transparent substrate 11 without the reflective film pattern 13 may define light-transmitting regions surrounding the reflective film patterns 13. The reflective film patterns 13 may have any suitable shape, e.g., circular or polygonal, and may correspond to the openings 3 of the vapor deposition mask 1.

The reflective film patterns 13 may be smaller than the openings 3, e.g., a diameter of the reflective film pattern 13 may be smaller than a diameter of an opening 3. Therefore, when the alignment master glass 10 and the vapor deposition mask 1 are superimposed, each opening 3 of the vapor deposition mask 1 may completely overlap a corresponding reflective film pattern 13 of the alignment master glass 10. For example, when the alignment master glass 10 and the vapor deposition mask 1 are superimposed, each reflective film pattern 13 of the alignment master glass 10 may be centered with respect to a corresponding opening 3 of the vapor deposition mask 1. As such, the reflective film patterns 13 may provide bases in the tensioning device in determining whether the vapor deposition mask 1 and the alignment master glass 10 are precisely aligned with each other.

Since the reflective film patterns 13 reflect light, they form bright portions (bright regions indicated by non-hatched regions in FIGS. 3-5) on the reflected light image when obtaining the reflected light image from the tensioning device. Since regions of the transparent substrate 11 without the reflective film patterns 13 are transparent regions that transmit light, such regions may be referred to as light-transmitting regions 12. Further, since light is not reflected from the light-transmitting regions 12, such regions may form dark portions on the reflected light image (hatched regions in FIGS. 2-6).

The reflective film patterns 13 may be made of a light-reflecting material, e.g., a metallic material. Examples of the metallic material may include, e.g., at least one of molybdenum (Mo), tungsten (W), aluminum (Al), and chrome (Cr), and metal oxides, such as aluminum oxide ($Al_2O_3$), zinc oxide (ZnO), indium tin oxide (ITO), and indium zinc oxide (IZO).

The reflective film patterns 13 may be formed on the transparent substrate 11 by a general coating method, e.g., spin coating, roll coating, etc. For example, when the reflective film patterns 13 are made of a metallic material, sputtering may be used to form the reflective film patterns 13.

In the alignment master glass 10, the reflective film patterns 13 for reflecting light are formed only within the regions corresponding to the openings 3 of the vapor deposition mask 1, and light-transmitting regions 12 that do not reflect light are formed in the other regions. For example, as shown in FIG. 2, the reflective film patterns 13 may be shaped as hexagons and may be arranged in a matrix pattern, e.g., at predetermined intervals in a rectangular pattern. Example embodiments are not limited thereto, and the reflective film patterns 13 may be arranged in various patterns.

In obtaining a reflected light image, the reflective film patterns 13 may be aligned such that the openings 3 of the vapor deposition mask 1 coincide, e.g., overlap, with the reflective film patterns 13. In other words, the reflective film patterns 13 may be formed to be smaller than the openings 3, so the reflective film patterns 13 may be positioned within the openings 3. For example, when the vapor deposition mask 1 and the alignment master glass 10 are superimposed, outer edges of the openings 3 may surround respective reflective film patterns 13. In addition, as illustrated in FIG. 3, the reflective film patterns 13 and the openings 3 may have the same shapes with a predetermined ratio of similarity.

As described above, since the alignment master glass 10 according to an embodiment includes light-reflecting regions, i.e., reflective film patterns 13, and light-transmitting regions 12, a reflected light image having a clear and distinct boundary may be obtained by tensioning the vapor deposition mask 1 using a tensioning device. The reflected light image may be captured, e.g., as illustrated in FIG. 5, to determine an alignment state. Thus, the vapor deposition mask 1 may be manufactured with high position accuracy.

Figure 8:
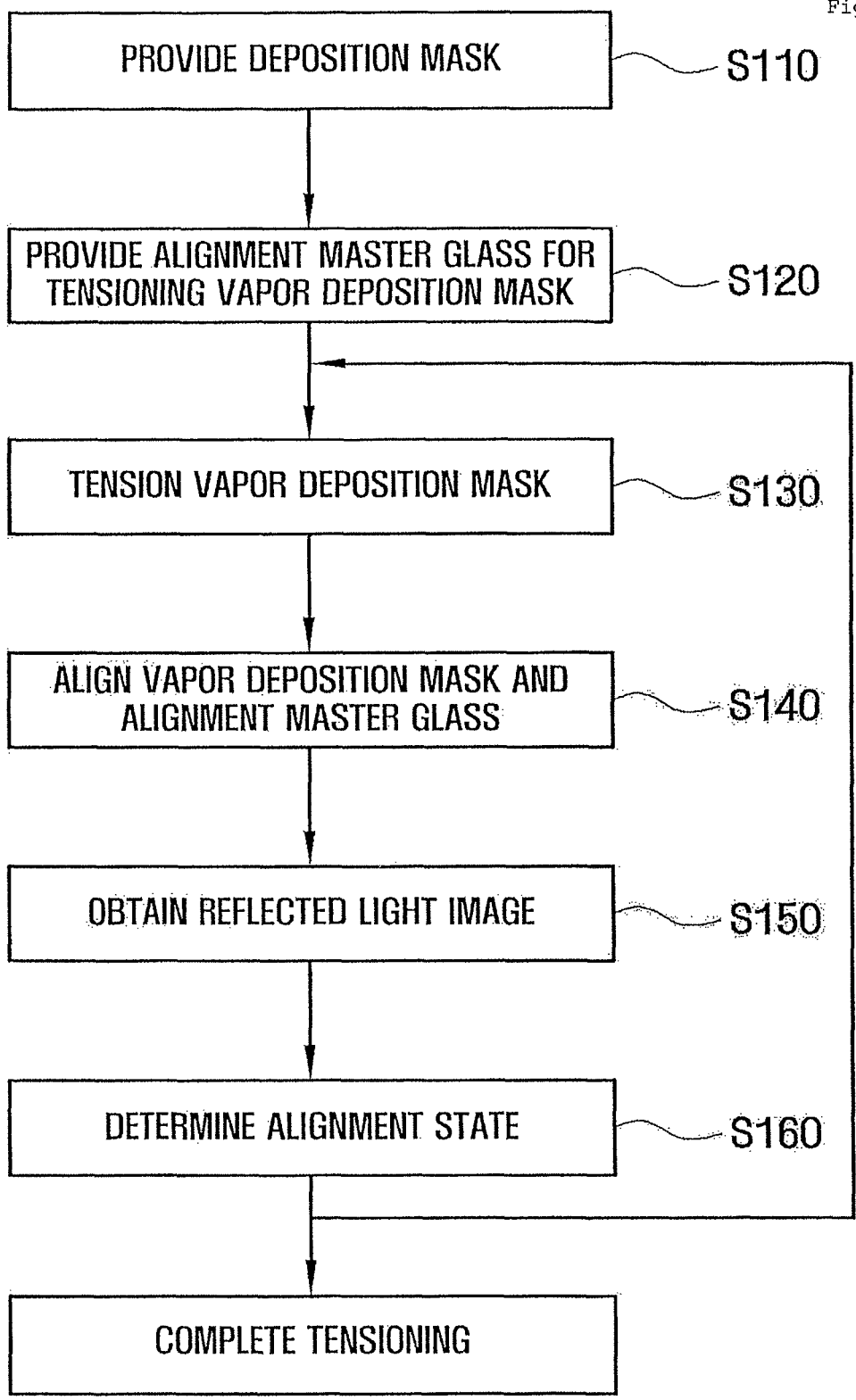
FIG. 8 illustrates a flow chart of a method for tensioning a vapor deposition mask using an alignment master glass according to an embodiment.

Next, a method for tensioning a vapor deposition mask using an alignment master glass according to an embodiment will be described with reference to FIG. 8. FIG. 8 is a flow chart of a method for tensioning a vapor deposition mask using an alignment master glass according to an embodiment. As an example, the alignment master glass 10 and vapor deposition mask 1 will be used for illustration.

The method for tensioning the vapor deposition mask 1 using the alignment master glass 10 may include providing a vapor deposition mask having a plurality of openings to deposit an organic material, providing alignment master glass for tensioning the vapor deposition mask having reflective film patterns formed at only locations corresponding to the openings of the vapor deposition mask, tensioning the vapor deposition mask using a tensioning device, allowing centers of the openings and centers of the reflective film patterns to coincide with each other, obtaining a reflected light image indicating an alignment state in which the centers of the openings of the vapor deposition mask and the centers of the reflective film patterns are aligned, and analyzing the reflected light image and determining the alignment state in which the openings of the vapor deposition mask and the reflective film patterns are aligned after tensioning, wherein a first region in the reflected light image between the aligned openings and the reflective film patterns correspond to dark portions.

A method for tensioning the vapor deposition mask 1 using the alignment master glass 10 according to another embodiment may include obtaining a reflected light image by irradiating light into openings formed on a vapor deposition mask and reflective film patterns formed on alignment master glass for tensioning the vapor deposition mask and obtaining the light reflected thereon to represent an alignment state in which centers of the openings and centers of the reflective film patterns are aligned, and analyzing the reflected light image and determining the alignment state in which the openings and the reflective film patterns are aligned after tensioning, wherein the reflected light image has a first region defined by the outer boundary of the aligned opening and the outer boundary of the reflective film pattern, and a second region excluding the first region, and the first region forms dark portions on the reflected light image and the second region forms bright portions on the reflected light image.

In detail, first, the vapor deposition mask 1 and the alignment master glass 10 may be provided (S110 and S120). The alignment master glass 10 may serve as the basis for determining a state after tensioning and an alignment state.

In order to form high-precision and secured vapor deposition mask, a metal thin plate with tension exerted thereon may be fixed to a support frame. By doing so, the vapor deposition mask 1 is unlikely to deform and sagging of the vapor deposition mask 1 is unlikely to occur, thereby enhancing durability of the vapor deposition mask 1 and allowing an organic material to be deposited thereon with accuracy even after repeated uses. The alignment master glass 10 may be provided to determine how the vapor deposition mask 1 is tensioned when tension is exerted on the vapor deposition mask 1, and to determine whether the openings 3 formed on the vapor deposition mask 1 are aligned in a desired pattern. Since the alignment master glass 10 according to an embodiment is the same as described above, a repeated description thereof will be omitted.

Next, the vapor deposition mask 1 may be tensioned using the tensioning device so as to prevent the vapor deposition mask 1 from deforming on the support frame during repeated uses (S130). The tensioning process may be performed based on one axis of the vapor deposition mask 1. Alternatively, the tensioning process may be repeatedly performed based on multiple axes.

Next, the openings 3 and the reflective film patterns 13 may be aligned in the tensioning device, such that centers of the opening 3 and centers of the reflective film patterns 13 coincide, e.g., overlap, with each other (S140).

In the tensioning device, the step of allowing the centers of the openings 3 and the centers of the reflective film patterns 13 to coincide with each other may includes sub-steps of measuring widths of the openings 3 based on one axis and determining the center of the openings 3, measuring widths of the reflective film patterns 13 based on the other axis and determining the center of the reflective film patterns 13, and shifting the vapor deposition mask 1 or the alignment master glass 10 to allow the center of the widths of the openings 3 and the center of the widths of the reflective film patterns 13 to coincide with each other. In addition, the allowing of the centers of the openings 3 and the centers of the reflective film patterns 13 to coincide with each other may include repeatedly performing the above stated sub-steps based on the one axis and the other axis. That is to say, after aligning through measuring of the widths of the openings 3 and the reflective film patterns 13 based on one axis and determining centers of the respective widths, aligning may further be performed through measuring the widths based on the one axis and the other axis. For example, the axis perpendicular to the one axis, and determining the centers of the respective widths.

Next, a reflected light image may be obtained, the reflected light image representing an alignment state in which the centers of the openings 3 of the vapor deposition mask 1 after tensioning and the centers of the reflective film patterns 13 are aligned (S150). The reflected light image may be automatically recognized and analyzed using the tensioning device to determine the alignment state of the openings 3 of the vapor deposition mask 1 and the reflective film patterns 13 (S160). Examples of the reflected light image are the same as described above with reference to FIGS. 3-5.

In contrast, if an alignment master glass includes a reflective surface with discontinuous light absorbing patterns thereon, i.e., a resultant image would have a reversed configuration in terms of light/dark regions with respect to the example embodiment described previously with reference to FIG. 2, alignment of such an alignment master glass with the vapor deposition mask 1 may cause light reflected from the openings 3 of the vapor deposition mask 1 and light reflected from the reflecting surface of the alignment master glass interfere with each other and offset each other. As such, a shadow region may be created between the openings 3 and the reflective surface 2 of the mask. Thus, the opening 3 may have an unclear and indistinct boundary, which is undesirable. In other words, since the reflective surface 2 cannot be distinguished from the reflective regions of the alignment master glass, the boundary and precise positioning of the openings 3 of the vapor deposition mask 1 cannot be determined or corrected, e.g., widths and/or centers of the openings 3 cannot be measured. Thus, an alignment error may be generated between the vapor deposition mask 1 and the alignment master glass, thereby lowering the position accuracy and resulting in a high probability of generating defects in tensioning the vapor deposition mask 1.

Therefore, in the tensioning method according to the example embodiments, a tensioned state may be definitely determined using the alignment master glass 10. That is to say, in the alignment master glass 10, in order to allow a first region between the aligned openings and the reflective film patterns to be formed as dark portions on the reflected light image, the first region is made of a material that does not reflect light. In detail, the first region is defined by a region between the outer boundary of the aligned opening and the outer boundary of the reflective film pattern. The first region can be maintained as the transparent substrate 11 of the alignment master glass 10. Thus, since the first region transmits light without reflecting light, it forms dark portions on the reflected light image. The reflected light image further includes a second region, i.e., a region excluding the first region, forming dark portions on the reflected light image.

As described above, in the tensioning method according to the example embodiment, since regions that reflect light onto a reflected light image are separately formed, a shadow region is not formed. Therefore, the opening has a clear and distinct boundary on the reflected light image. Thus, the boundary may be recognized by the tensioning device, and the alignment state in which the vapor deposition mask and the alignment master glass are aligned may be precisely determined.

In addition, determining of the alignment state may include measuring widths of the openings based on one axis and determining centers of the widths of the openings, measuring widths of the reflective film patterns based on the one axis and determining centers of the widths of the reflective film patterns, and determining whether the centers of the widths of the openings coincide with the centers of the widths of the reflective film patterns. In order to determine the alignment state by determining the widths and centers more precisely, determining the widths and centers of the openings and the reflective film patterns to determine the alignment state may be repeatedly performed based on the one axis and the other axis.

If the centers of the openings do not coincide with the centers of the reflective film patterns, the tensioning method may further include, after the determining of the alignment state, repeatedly performing steps of tensioning the vapor deposition mask based on the non-coincident axis using the tensioning device (S130), aligning the openings and the reflective film patterns in the tensioning device such that centers of the opening and centers of the reflective film patterns are allowed to coincide with each other (S140), obtaining a reflected light image obtained, the reflected light image representing an alignment state in which the centers of the openings of the vapor deposition mask after tensioning and the centers of the reflective film patterns are aligned (S150), and analyzing the reflected light image analyzing the reflected light image and determining the alignment state in which the openings and the reflective film patterns are aligned after tensioning (S160).

While the example embodiments has been particularly shown and described with reference to exemplary embodiments thereof, it will be understood by those of ordinary skill in the art that various changes in form and details may be made therein without departing from the spirit and scope of the example embodiments as defined by the following claims. It is therefore desired that the present embodiments be considered in all respects as illustrative and not restrictive, reference being made to the appended claims rather than the foregoing description to indicate the scope of the invention.

What is claimed is:

1. A method for tensioning a vapor deposition mask using an alignment master glass, the method comprising:
   providing the vapor deposition mask having a plurality of deposition openings, the deposition openings in the vapor deposition mask each being configured to deposit an organic material therethough during vapor deposition;
   providing the alignment master glass configured to tension the vapor deposition mask, the alignment master glass including reflective film patterns formed at only locations corresponding to the deposition openings of the vapor deposition mask,
   wherein the reflective film patterns are at all locations corresponding to the plurality of deposition openings of the vapor deposition mask;
   tensioning the vapor deposition mask using a tensioning device;
   allowing centers of the deposition openings and centers of the reflective film patterns to coincide with each other;
   obtaining a reflected light image indicating an alignment state in which the centers of the deposition openings of the vapor deposition mask and the centers of the reflective film patterns are aligned; and
   analyzing the reflected light image and determining the alignment state in which the deposition openings of the vapor deposition mask and the reflective film patterns are aligned after tensioning,
   wherein a first region in the reflected light image between the aligned deposition openings and the reflective film patterns correspond to dark portions.

2. The method as claimed in claim 1, further comprising repeatedly performing the steps of tensioning through analyzing based on a first axis and a second axis of the vapor deposition mask, when the centers of the deposition openings do not coincide with the centers of the reflective film patterns.

3. The method as claimed in claim 1, wherein the first region is defined by a region between outer boundaries of aligned deposition openings and respective reflective film patterns.

4. The method as claimed in claim 3, wherein the reflected light image further includes a second region excluding the first region, the second region forming bright portions on the reflected light image.

5. The method as claimed in claim 1, wherein allowing the centers of the deposition openings and the centers of the reflective film patterns to coincide includes:
   measuring widths of the deposition openings based on a first axis and determining the centers of the deposition openings;
   measuring widths of the reflective film patterns based on a second axis and determining the centers of the reflective film patterns; and
   shifting the vapor deposition mask or the alignment master glass to allow the centers of the widths of the deposition openings and the centers of the widths of the reflective film patterns to coincide with each other.

6. The method as claimed in claim 5, wherein allowing the centers of the deposition openings and the centers of the reflective film patterns to coincide further comprises repeatedly performing the steps of measuring through shifting based on the first and second axes.

7. The method as claimed in claim 1, wherein analyzing the reflected light image and determining the alignment state includes:
   measuring widths of the deposition openings based on a first axis and determining centers of the widths of the deposition openings;
   measuring widths of the reflective film patterns based on a second axis and determining centers of the widths of the reflective film patterns; and
   determining whether the centers of the widths of the deposition openings coincide with the centers of the widths of the reflective film patterns.

8. The method as claimed in claim 7, wherein analyzing the reflected light image and determining the alignment state further comprises repeatedly performing the steps of measuring through determining based on the first and second axes.

9. A method for tensioning a vapor deposition mask using an alignment master glass, the method comprising:
   providing the vapor deposition mask having a plurality of deposition openings, the deposition openings in the vapor deposition mask each being configured to deposit an organic material therethough during vapor deposition;
   providing the alignment master glass configured to tension the vapor deposition mask, the alignment master glass including reflective film patterns formed at only locations corresponding to the deposition openings of the vapor deposition mask,
   wherein the reflective film patterns are at all locations corresponding to the plurality of deposition openings of the vapor deposition mask;
   obtaining a reflected light image by irradiating light into deposition openings formed in the vapor deposition mask and into reflective film patterns formed in the alignment master glass configured to tension the vapor deposition mask, the reflected light image representing an alignment state in which centers of the deposition openings and centers of the reflective film patterns are aligned,
   analyzing the reflected light image; and
   determining the alignment state in which the deposition openings and the reflective film patterns are aligned after tensioning,
   wherein the reflected light image has a first region defined between outer boundaries of the aligned deposition openings and respective reflective film patterns, and a second region excluding the first region, the first and second regions forming respective dark and bright portions on the reflected light image.

10. The method as claimed in claim 9, wherein each of the reflective film patterns is smaller than a respective deposition opening.

11. The method as claimed in claim 9, wherein the reflective film patterns are made of a metallic material that reflects light.

12. The method as claimed in claim 11, wherein the reflective film patterns are made of at least one of molybdenum (Mo) and tungsten (W).

13. A method for tensioning a vapor deposition mask using an alignment master glass, the method comprising:
   providing the vapor deposition mask having a plurality of deposition openings, the deposition openings in the vapor deposition mask each being configured to deposit an organic material therethough during vapor deposition;
   providing the alignment master glass configured to tension the vapor deposition mask, the alignment master glass including reflective film patterns formed at only locations corresponding to the openings of the vapor deposition mask,
   wherein the reflective film patterns are at all locations corresponding to the plurality of deposition openings of the vapor deposition mask;
   determining an alignment state between the alignment master glass and the vapor deposition mask; and
   applying force to the vapor deposition mask in accordance with the alignment state.

* * * * *